United States Patent
Wang et al.

[11] Patent Number: 6,146,946
[45] Date of Patent: Nov. 14, 2000

[54] METHOD OF FABRICATING A FLASH MEMORY

[75] Inventors: Ling-Sung Wang, Hsinchu; Jyh-Ren Wu, Taipei, both of Taiwan

[73] Assignee: Worldwide Semiconductor Manufacturing Corp., Hsinchu, Taiwan

[21] Appl. No.: 09/417,393

[22] Filed: Oct. 13, 1999

[30] Foreign Application Priority Data

Aug. 2, 1999 [TW] Taiwan .................................. 88113167

[51] Int. Cl.$^7$ .................................................. H01L 21/336
[52] U.S. Cl. ............................ 438/264; 438/594; 438/595
[58] Field of Search .................................. 438/264, 257, 438/593, 594, 595, FOR 158, FOR 199, FOR 203

[56] References Cited

U.S. PATENT DOCUMENTS 5,847,427 12/1998 Hagiwara .
6,040,216  3/2000 Sung .

*Primary Examiner*—George Fourson
*Assistant Examiner*—Joannie A. Garcia
*Attorney, Agent, or Firm*—Jiawei Huang; J. C. Patents

[57] ABSTRACT

The invention describes a method of fabricating an integrated circuit used to prevent undercutting of an oxide layer due to wet etching. A semiconductor substrate has a gate formed thereon. A conformal oxide layer is formed to cover the gate. Then, a nitrogen ion implantation process is performed to introduce nitrogen ions into the surface of the conformal oxide layer. A high temperature thermal oxidation is performed in order to form Si—N bonds, that is, the nitrogen ions bonding with the silicon atoms of the conformal oxide layer, or to form Si—ON bonds, that is, the nitrogen ions bonding with the oxygen atoms of the conformal oxide layer. A dielectric layer, which covers the conformal oxide layer, is formed. Thereafter, the dielectric layer is etched back to form spacers on the sidewalls of the gate. A wet etching process is performed to remove a part of the conformal oxide layer exposed by the spacers.

16 Claims, 2 Drawing Sheets

METHOD OF FABRICATING A FLASH MEMORY

CROSS-REFERENCE TO RELATED APPLICATION

This application claims the priority benefit of Taiwan application serial no. 88113167, filed Aug. 2, 1999, the full disclosure of which is incorporated herein by reference.

BACKGROUND OF THE INVENTION

1. Field of the Invention

The invention relates to a method of fabricating an integrated circuit, and more particularly relates to a method of fabricating a flash memory that has improved conformal oxide covering gates.

2. Description of the Related Art

The split-gate flash memory has some advantages over the stack gate flash memory such as lower program current and the over-erase free issue. However, the process steps for manufacturing the split-gate flash memory are more complicated and the most important problem is the polysilicon stringers that result after a selective gate etching process. The polysilicon stringers induce read disturb problem in the split-gate flash memory.

A method of fabricating the split-gate flash memory comprises the steps of forming a gate on a substrate, then forming silicon nitride spacers on the sidewalls of the gate, and so on. The silicon nitride spacers on the sidewalls of the gate are important for program efficiency and data retention. The processes typically comprise a step of forming a peripheral gate oxide before the silicon nitride spacers are formed. After forming the silicon nitride spacers, the substrate must be dipped in HF solution to remove the remaining oxide exposed by the silicon nitride spacers on the sidewalls of the gate before a gate oxide is formed on a peripheral region.

FIG. 1 is schematic, cross-sectional view illustrating the substrate after dipping in the HF solution according to above-mentioned method. Referring to FIG. 1, reference numbers 10, 12, 14, 16 respectively indicate the substrate, the gate, the oxide layer and the silicon nitride spacers. The oxide layer 14 under the silicon nitride spacers 16 suffers an undercut, indicated by are 18. This undercut phenomenon causes the polysilicon stringer problem and the read disturb problem.

SUMMARY OF THE INVENTION

The invention provides a method of fabricating an integrated circuit that prevents undercutting of an oxide layer due to a wet etching. A semiconductor substrate having a gate is provided. A conformal oxide layer is formed to cover the gate. Then, a nitrogen ion implantation process is performed to introduce nitrogen ions into the surface of the conformal oxide layer. A high temperature thermal oxidation is performed in order to form Si—N bonds, that is, the nitrogen ions bond with the silicon atoms of the conformal oxide layer, or to form Si—ON bonds, that is, the nitrogen ions bond with the oxygen atoms of the conformal oxide layer. A dielectric layer, which covers the conformal oxide layer, is formed. Thereafter, the dielectric layer is etched back to form spacers on the sidewall of the gate. A wet etching process is performed to remove a part of the conformal oxide layer that is not covered by the spacers.

In one preferred embodiment of the method of the present invention, the nitrogen ion implantation has a dosage of about 10E13/cm$^2$ to about 10E15/cm$^2$ at about 5 KeV to about 40 KeV. The high temperature process can be combined with the step of forming the dielectric layer. The dielectric layer can be formed by high temperature chemical vapor deposition. The high temperature process makes the nitrogen ions bond with silicon atoms or oxygen atoms in the conformal oxide layer and form Si—N or Si—O—N chemical bonds on the surface of the conformal oxide layer. After the anisotropic etching back process for forming the spacers and an over-etching process are performed, the thickness of the conformal oxide layer that isn't covered with the spacers is reduced. The conformal oxide layer that is covered with the spacers includes more Si—N bond or Si—ON bonds than the conformal oxide layer that isn't covered with the spacers. As the Si—N bond or the Si—ON bonds thus formed can reduce the etching rate of the conformal oxide layer, consequently, the undercut phenomenon during the wet etching process for removing the part of conformal oxide layer can be avoided.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A–2E are schematic, cross-sectional views illustrating of a method of fabricating a split flash memory cell according to a preferred embodiment of the method according to the present invention.

Figure 1:
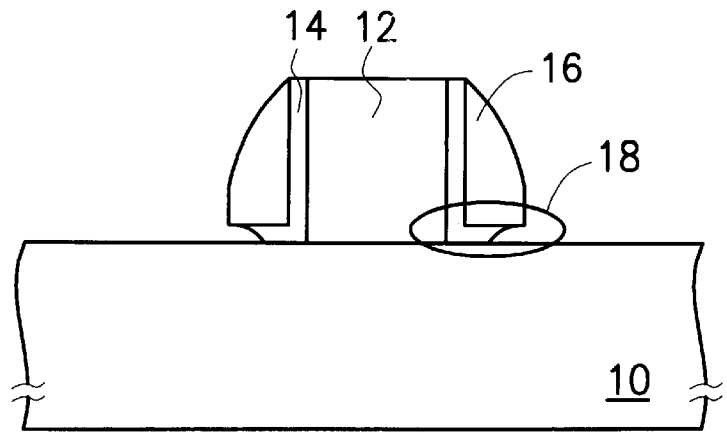
FIG. 1, is schematic, cross-sectional views illustrating of the substrate after dipping in the HF solution according to the prior art method.
Figure 2A:
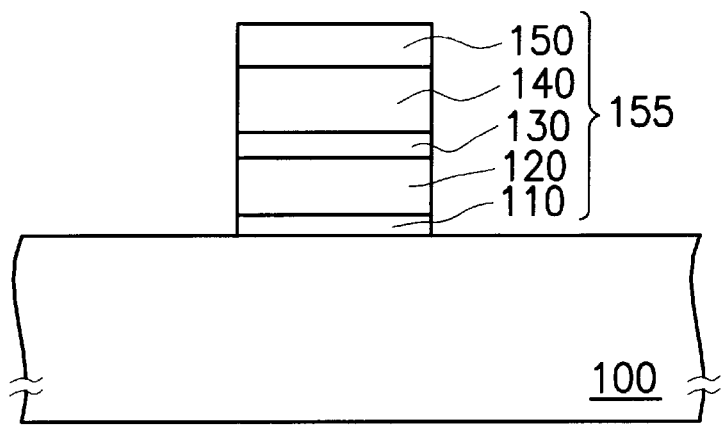
FIGS. 2A–2E are schematic, cross-sectional views illustrating of a method of fabricating a split flash memory cell according to a preferred embodiment of the method according to the present invention.

Referring to FIG. 2A, a gate structure 155 of a flash memory cell is formed on a semiconductor substrate 100. The gate structure 155 comprises a tunneling oxide layer 110, a floating gate 120, a dielectric layer 130, a control gate 140, and a cap layer 150. The tunneling oxide layer 110 is, for example, about 80 Angstroms to about 120 Angstroms thick. A material of the floating gate 120 comprises an in-situ polysilicon layer formed by, for example, chemical vapor deposition to a thickness of about 1000 Angstroms to about 1500 Angstroms. The dielectric layer 130 is, for example, an oxide/nitride/oxide (ONO) layer. A material of the control gate 140 comprises a polysilicon layer formed by, for example, chemical vapor deposition to a thickness of about 1500 Angstroms to about 2000 Angstroms. A dopant, for example, phosphorous ions, is added into the polysilicon to induce conductivity. The cap layer 150 comprises a silicon oxide layer formed by, for example, CVD using tetra-ethyl-ortho-silicate (TEOS) as source. The layers 110, 120, 130, 140, and 150 are typically patterned by photolithography and etching processes. In the present invention, the gate structure 155 is not limited to the above-maintained layer 110, 120, 130, 140, and 150. Other gate structures for integrated circuits are included in the scope of the prevent invention.

Figure 2B:
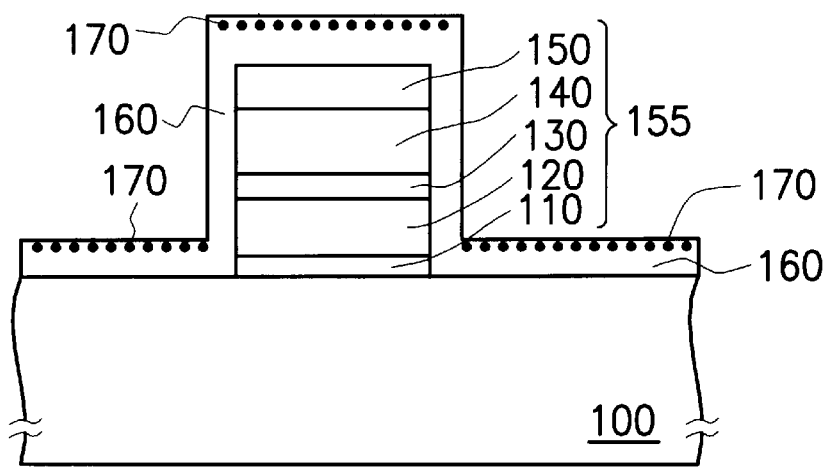

Referring to FIG. 2B, a conformal oxide layer 160 is formed on the substrate 100 to cover the gate structure 155. The conformal oxide layer 160 comprises, for example, a high thermal oxide layer or a TEOS oxide layer. Then, nitrogen ions 170 are introduced into the surface of the conformal oxide layer 160. The method of introducing nitrogen ions comprises an anisotropically vertical ion implantation process. Preferably, nitrogen ions are implanted, at about 5 KeV to about 40 KeV, with a dosage of about $10E13/cm^2$ to about $10E15/cm^2$. Because the ion implantation process is anisotropically vertical, the nitrogen ions are not introduced into the conformal oxide layer 160 through the sidewalls of the gate structure 155.

Figure 2C:
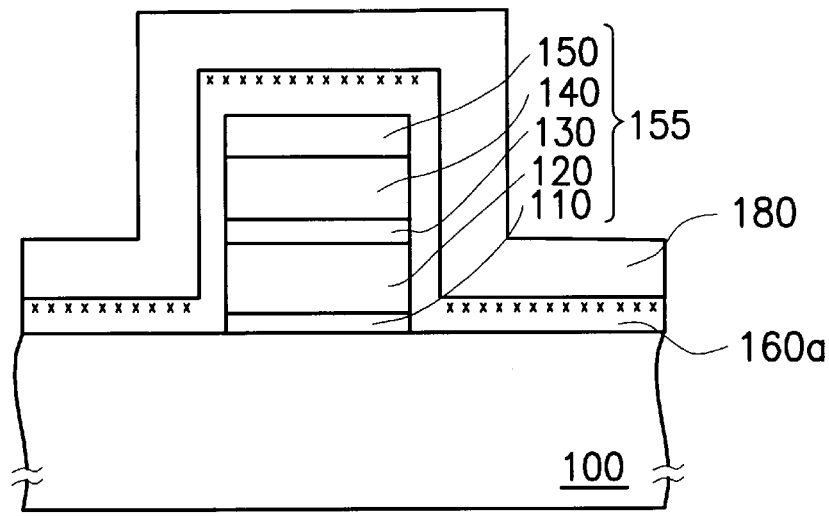

Referring to FIG. 2C, a high temperature process is performed at, for example, a temperature of about 700° C. to about 900° C. to make the nitrogen ions bond with silicon atoms or oxygen atoms in the conformal oxide layer 160 and form Si—N or Si—O—N chemical bonds. Due to the high temperature process, the conformal oxide layer 160 is changed into a conformal oxide layer 160a, which is hardened. Hardening the conformal oxide layer 160a reduces its etching rate in subsequent etching processes.

Figure 2D:
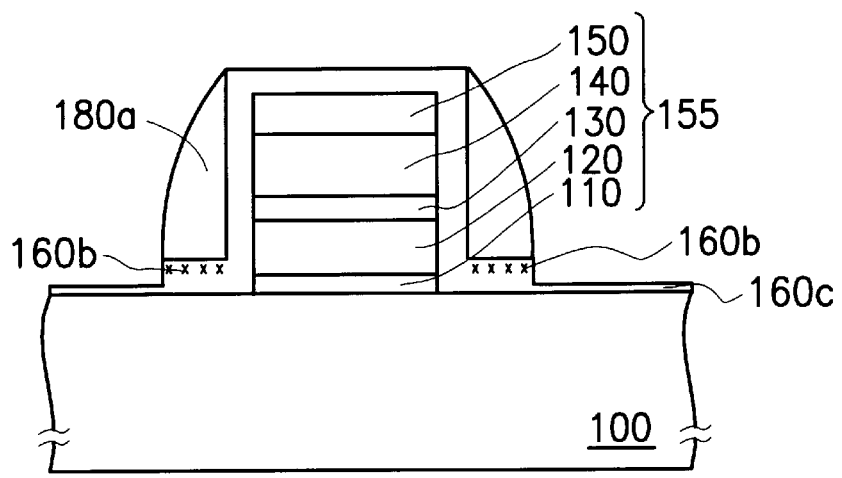

Preferably, the high temperature process is performed in combination with a step of forming spacers 180a on the sidewalls of the gate 155, as shown in FIG. 2D. A dielectric layer 180 for forming spacers 180a is formed over the substrate 100, as shown in FIG. 2C. Preferably, the dielectric layer 180 is formed by, for example, high temperature chemical vapor deposition. A material of the dielectric layer 180 comprises silicon nitride. Since the high temperature CVD process is performed at about 700° C. to about 900° C., the nitrogen ions 170 bond with silicon atoms or oxygen atoms in the conformal oxide layer 160 and form Si—N or Si—O—N chemical bonds. The conformal oxide layer 160 is changed into a conformal oxide layer 160a, which is hardened.

Referring to FIG. 2D, an anisotropic etching back process is performed on the dielectric layer 180 to form spacers 180a on the sidewalls of the gate structure 155. The conformal oxide layer 160a is used as an etching stop layer in the anisotropic etching process. In order to remove completely the dielectric layer 18 over the gate 155, the process usually also comprises an over-etching process. The conformal oxide layer 160a exposed by the spacers 180a is also partially etched during the over-etching process. Consequently, the thickness of the conformal oxide layer 160a exposed by the spacers 180a is reduced to form a layer 160c, and the thickness of the conformal oxide layer 160a covered by the spacers 180a is retained to form a layer 160b. The nitrogen ions 170 are introduced into the surface of the conformal oxide layer 160 so that the layer 160b has more Si—N bonds or Si—ON bonds than the layer 160c after the high temperature process and the anisotropic etching back process are performed.

Figure 2E:
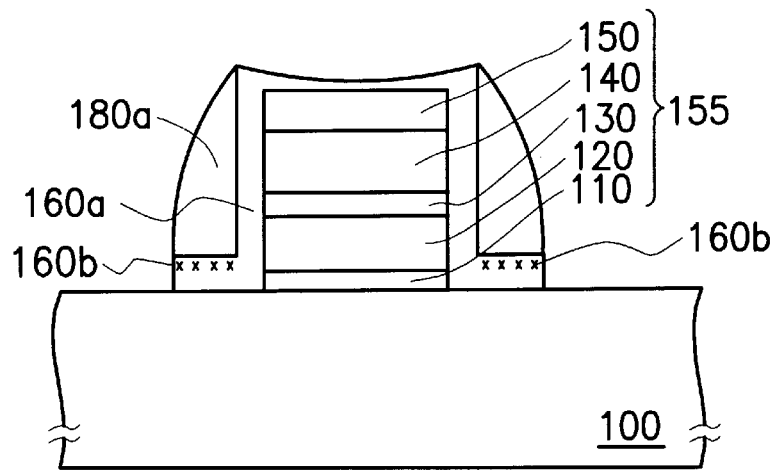

Referring to FIG. 2E, a wet etching process is performed by a buffer oxide etchant, a dilute hydrofluoric acid etchant, or like etchants to remove the layer 160b. As the layer 160b has more Si—N bonds or Si—ON bonds than the layer 160c, the layer 160b is firmer than the layer 160c and etching rate of the layer 160b is lower than that of the layer 160b during the wet etching process. Consequently, the phenomenon of the undercut can be avoided.

The method of the present invention introduces nitrogen ions into the surface of the conformal oxide layer and performs a high temperature thermal oxidation to make the conformal oxide layer form Si—N bonds or Si—ON bonds.

As the Si—N bonds or the Si—ON bonds thus formed can reduce the etching rate of the conformal oxide layer, consequently, the undercut phenomenon during the wet etching process for removing the part of conformal oxide layer can be avoided. The polysilicon stringer problem and the read disturb problem can be prevented.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a split gate flash memory cell, comprising the steps of:

providing a semiconductor substrate;

forming a gate structure, the gate structure include a tunneling oxide layer, a floating gate, a first dielectric layer, and a control gate on the semiconductor substrate;

forming a conformal oxide layer containing silicon atoms over the semiconductor substrate to cover the gate structure;

performing a nitrogen ion implantation to introduce nitrogen ions into a surface of the conformal oxide layer;

forming a second dielectric layer covering the conformal oxide layer by high temperature chemical vapor deposition, such that Si—N and Si—O—N chemical bonds are formed in the conformal oxide layer;

etching back the second dielectric layer, using the conformal oxide layer over the gate as an etching end point, to form spacers on sidewalls of the gate structure; and performing a wet etching process to remove the conformal oxide layer exposed by the spacers.

2. The method as claimed in claim 1, wherein the nitrogen ion implantation is performed with a dosage of about $10E13/cm^2$ to about $10E15/cm^2$.

3. The method as claimed in claim 1, wherein the nitrogen ion implantation is performed at about 5 KeV to about 40 KeV.

4. The method as claimed in claim 1, wherein the second dielectric layer comprises a silicon nitride layer.

5. The method as claimed in claim 1, further comprising a step of an over-etching process before the wet etching process is performed.

6. The method as claimed in claim 1, wherein the second dielectric layer is formed at a temperature of about 700° C. to about 900° C.

7. The method as claimed in claim 1, wherein the wet etching process is performed by a buffer oxide etchant.

8. The method as claimed in claim 1, wherein the wet etching process is performed by a dilute hydrofluoric acid etchant.

9. A method fabricating a hardened conformal oxide layer covering a gate structure of a split gate flash memory cell, comprising:

providing the gate structure on a semiconductor substrate;

forming a conformal oxide layer containing silicon atoms over the semiconductor substrate to cover the gate;

performing a nitrogen ion implantation to introduce nitrogen ions into the conformal oxide layer; and performing a high temperature process to make the nitrogen ions bond with the silicon atoms or oxygen atoms to form Si—N and Si—O—N chemical bonds in the conformal oxide layer.

10. The method as claimed in claim 9, wherein the nitrogen ion implantation is performed with a dosage of about $10E13/cm^2$ to about $10E15/cm^2$.

11. The method as claimed in claim 9, wherein the nitrogen ion implantation is performed at about 5 KeV to about 40 KeV.

12. The method as claimed in claim 9, wherein the high temperature process is performed at a temperature of about 700° C. to about 900° C.

13. A method of fabricating an integrated circuit, comprising the steps of:

providing a semiconductor substrate;

forming a gate structure on the semiconductor substrate;

forming a conformal oxide layer over the semiconductor substrate to cover the gate structure;

performing a nitrogen ion implantation to introduce nitrogen ions into a surface of the conformal oxide layer;

forming silicon nitride spacers on sidewalls of the gate structure, wherein the nitride spacers are formed by a high temperature deposition process such that Si—N and Si—O—N chemical bonds are formed in the conformal oxide layer; and performing a wet etching process to remove the conformal oxide layer exposed by the spacers.

14. The method as claimed in claim 13, wherein the nitrogen ion implantation is performed with a dosage of about $10E13/cm^2$ to about $10E15/cm^2$.

15. The method as claimed in claim 13, wherein the nitrogen ion implantation is performed at about 5 KeV to about 40 KeV.

16. The method as claimed in claim 13, wherein the silicon nitride spacers are formed at a temperature of about 700° C. to about 900° C.

* * * * *